(12) United States Patent
Fujise

(10) Patent No.: US 6,985,031 B2
(45) Date of Patent: Jan. 10, 2006

(54) SEMICONDUCTOR INTEGRATED CIRCUIT

(75) Inventor: Takashi Fujise, Shiajiri (JP)

(73) Assignee: Seiko Epson Corporation (JP)

( * ) Notice: Subject to any disclaimer, the term of this patent is extended or adjusted under 35 U.S.C. 154(b) by 34 days.

(21) Appl. No.: 10/666,845

(22) Filed: Sep. 19, 2003

(65) Prior Publication Data

US 2004/0119532 A1 Jun. 24, 2004

(30) Foreign Application Priority Data

Sep. 19, 2002 (JP) .......................... 2002-272471

(51) Int. Cl.
*H03F 3/45* (2006.01)

(52) U.S. Cl. .................... 330/69; 330/252; 330/253
(58) Field of Classification Search .................. 330/69, 330/252, 253, 255, 262, 263, 264
See application file for complete search history.

(56) References Cited

U.S. PATENT DOCUMENTS

| | | | | |
|---|---|---|---|---|
| 5,083,051 A | * | 1/1992 | Whatley et al. | 330/252 |
| 6,066,985 A | * | 5/2000 | Xu | 330/253 |
| 6,480,178 B1 | * | 11/2002 | Itakura et al. | 330/252 |
| 6,501,252 B2 | * | 12/2002 | Fujise | 330/255 |

FOREIGN PATENT DOCUMENTS

| | | |
|---|---|---|
| JP | 58-188931 | 11/1983 |
| JP | 61-079312 | 4/1986 |
| JP | 63-133708 | 6/1988 |
| JP | 02-159118 | 6/1990 |
| JP | 07-106875 | 4/1995 |
| JP | 11-150427 | 6/1999 |
| JP | 2001-358570 | 12/2001 |
| JP | 2002-123326 | 4/2002 |

OTHER PUBLICATIONS

Communication from Japanese Patent Office regarding related application.
Communication from Chinese Patent Office regarding related application.

* cited by examiner

*Primary Examiner*—Khanh V. Nguyen
(74) *Attorney, Agent, or Firm*—Harness, Dickey & Pierce, P.L.C.

(57) ABSTRACT

A semiconductor integrated circuit is provided comprising a first amplifier circuit which receives a first potential and then supplies a current to an output terminal; a second amplifier circuit which receives a second potential and then absorbs a current from the output terminal; and a control circuit which controls the second amplifier circuit so as to allow the second amplifier circuit to be activated subsequently to a predetermined period of time that elapses after the first amplifier circuit is activated.

5 Claims, 5 Drawing Sheets

SEMICONDUCTOR INTEGRATED CIRCUIT

BACKGROUND OF THE INVENTION

1. Field of the Invention

The present invention relates to a semiconductor integrated circuit such as an LCD driver including a voltage-follower power circuit which supplies a given voltage to a load in a push-pull manner.

2. Description of the Related Art

Some power circuits for conventional LCD drivers employ a push-pull method as shown in FIG. 5. The power circuit shown in FIG. 5 includes a first amplifier circuit 100 which supplies a current from a power potential $V_{DD}$ of the high-voltage side to an output terminal by using a p-channel transistor of the output stage, and a second amplifier circuit 200 which allows a current to be absorbed into a power potential $V_{SS}$ of the low-voltage side from the output terminal by using an n-channel transistor of the output stage.

A first potential $V_{10}$ and a second potential $V_{20}$, which are obtained by dividing a given potential $V_L$ of the low-voltage side and a given potential $V_H$ of the high-voltage side by resistors R10, R20, and R30, are applied to the amplifier circuits 100 and 200, respectively. Since the lower first potential $V_{10}$ is applied to the first amplifier circuit 100 and the higher second potential $V_{20}$ is applied to the second amplifier circuit 200, the p-channel transistor of the output stage of the first amplifier circuit 100 and the n-channel transistor of the output stage of the second amplifier circuit 200 generally do not operate simultaneously.

However, when the power circuit is activated, the potential at each component is unstable. Consequently, the p-channel transistor of the output stage of the first amplifier circuit 100 and the n-channel transistor of the output stage of the second amplifier circuit 200 may operate simultaneously, which can undesirably cause a large current. Moreover, another problem is that an output voltage of the power circuit oscillates as if to ripple when increasing an offset of the first potential $V_{10}$ and the second potential $V_{20}$ by increasing the value of the resistor R20.

Japanese Unexamined Patent Application Publication No. 61-79312 describes a DC amplifier comprising an offset adjustment means which inputs DC elements included in the output of an amplifier to a window comparator, successively sends a control signal to a multiplexer by operating a comparison resistor upon exceeding a certain level, and controls the midpoint of the common source resistor of a first stage amplifier.

Japanese Unexamined Patent Application Publication No. 7-106875 describes a semiconductor integrated circuit comprising differential transistors, a transistor for current source connected to source electrodes connected to each other in the differential transistors, a resistor and a current source transistor for current source connected in parallel to the above-mentioned transistors, and a comparator which compares voltages of both ends of the resistor with a reference voltage and brings its output to the two transistors for current source.

However, the technologies described in these applications are not for controlling push-pull operations of the output stage, but for adjusting DC offsets of output potentials.

Taking the above-mentioned facts into consideration, an object of the present invention is to prevent a large current flowing from a p-channel transistor to an n-channel transistor of the output stage when a power circuit is activated in a semiconductor integrated circuit comprising the power circuit which supplies a given voltage to a load in a push-pull manner.

SUMMARY

To achieve the above-mentioned object, the semiconductor integrated circuit according to the present invention comprises a first amplifier circuit which receives a first potential and then supplies a current to an output terminal; a second amplifier circuit which receives a second potential and then absorbs a current from the output terminal; and a control circuit which controls the second amplifier circuit so as to allow the second amplifier circuit to be activated subsequently to a predetermined period of time that elapses after the first amplifier circuit is activated.

The semiconductor integrated circuit may further comprise a potential generating circuit, which generates a first potential and a second potential so as to make the first potential higher than the second potential.

In such a semiconductor integrated circuit, the first amplifier circuit may comprise a first differential amplifier and a p-channel transistor of the output stage, and the second amplifier circuit may comprise a second differential amplifier and an n-channel transistor of the output stage.

In this case, the first amplifier circuit may comprise a transistor which makes the p-channel transistor of the output stage cut off according to a first control signal in a first mode, and the second amplifier circuit may comprise a transistor which makes the n-channel transistor of the output stage cut off according to a second control signal in the first and a second mode.

Furthermore, the first amplifier circuit may comprise a transistor which supplies a current to two transistors forming a differential pair of the first differential amplifier according to a first control signal in the second mode and a third mode, and the second amplifier circuit may comprise a transistor which supplies a current to two transistors forming a differential pair of the second differential amplifier according to a second control signal in the third mode.

In the above-mentioned case, the control circuit may, by counting a clock signal, make the state of a second control signal supplied to the second amplifier circuit change subsequently to a predetermined period of time that elapses after the state of a first control signal supplied to the first amplifier circuit changes.

According to the present invention comprised as mentioned, in the semiconductor integrated circuit comprising a power circuit, which supplies a given voltage to a load in a push-pull manner, a large current flowing from a p-channel transistor to an n-channel transistor of the output stage when the power circuit is activated can be prevented. This is achieved by allowing the second amplifier circuit, which allows a current to be absorbed into the n-channel transistor from an output terminal, to be activated subsequently to a predetermined period of time that elapses after the first amplifier circuit is activated, which supplies a current from the p-channel transistor to the output terminal.

DETAILED DESCRIPTION

An embodiment of the present invention is described below based on the drawings.

Figure 1:
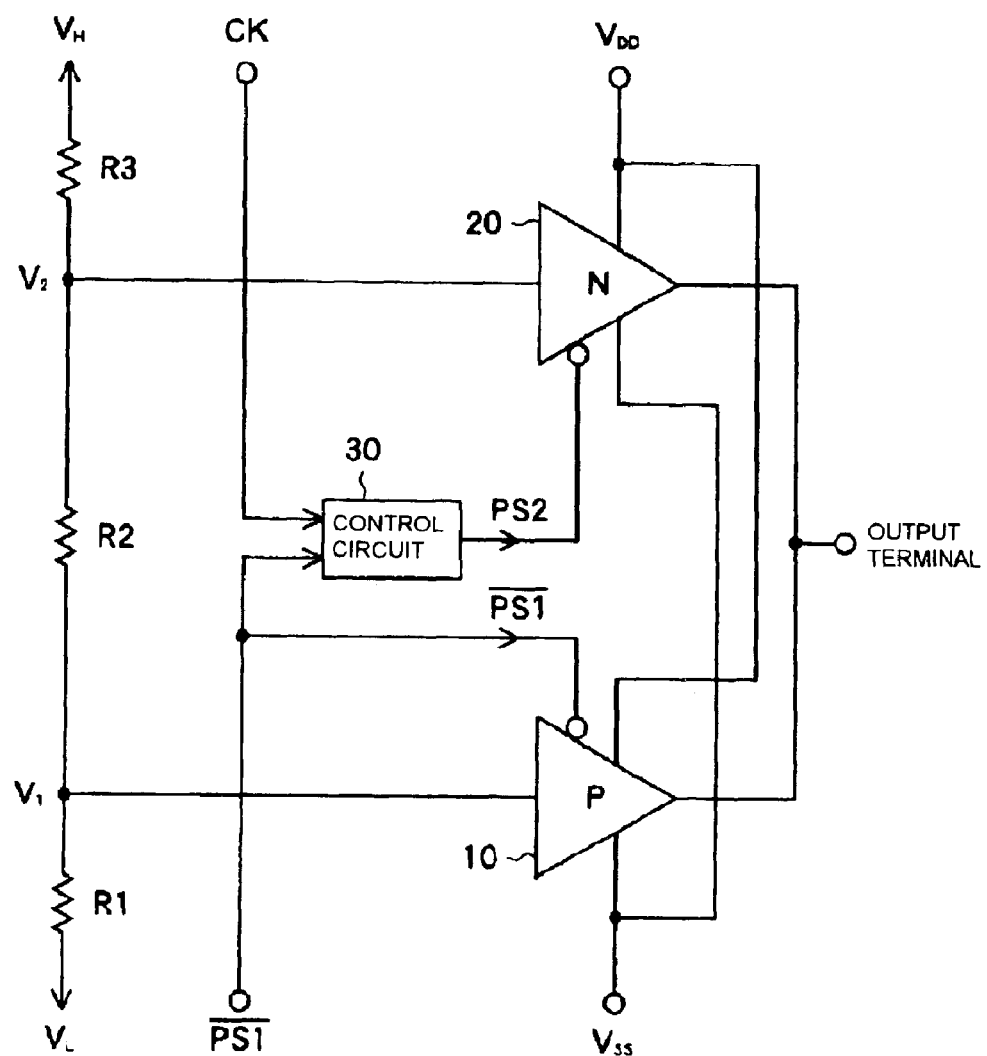
FIG. 1 shows the structure of a power circuit included in a semiconductor integrated circuit according to an embodiment of the present invention.

FIG. 1 shows the structure of a power circuit included in a semiconductor integrated circuit according to an embodiment of the present invention. As shown in FIG. 1, the power circuit comprises a first amplifier circuit 10 which supplies a current to an output terminal in accordance with a first control signal PS1 bar by using a p-channel transistor of the output stage; a second amplifier circuit 20 which absorbs a current from the output terminal in accordance with a second control signal PS2 by using an n-channel transistor of the output stage; and a control circuit 30 which generates the second control signal PS2 based on the first control signal PS1 bar so as to make the second amplifier circuit 20 be activated subsequently to a predetermined period of time that elapses after the first amplifier circuit 10 is activated.

A first potential $V_1$ and a second potential $V_2$, which are obtained by dividing a given potential $V_L$ of a low-voltage side and a given potential $V_H$ of a high-voltage side by resistors R1, R2, and R3, are applied to the amplifier circuits 10 and 20, respectively. The lower first potential $V_1$ is applied to the first amplifier circuit 10, while the higher second potential $V_2$ is applied to the second amplifier circuit 20. When the power circuit is activated, the p-channel transistor of the output stage of the first amplifier circuit 10 and the n-channel transistor of the output stage of the second amplifier circuit 20 may operate simultaneously because the potential at each component is unstable. However, activating the second amplifier circuit 20 subsequently to a predetermined period of time that elapses after the first amplifier circuit 10 is activated, can prevent a large current flowing in the amplifier circuits 10 and 20.

Figure 2:
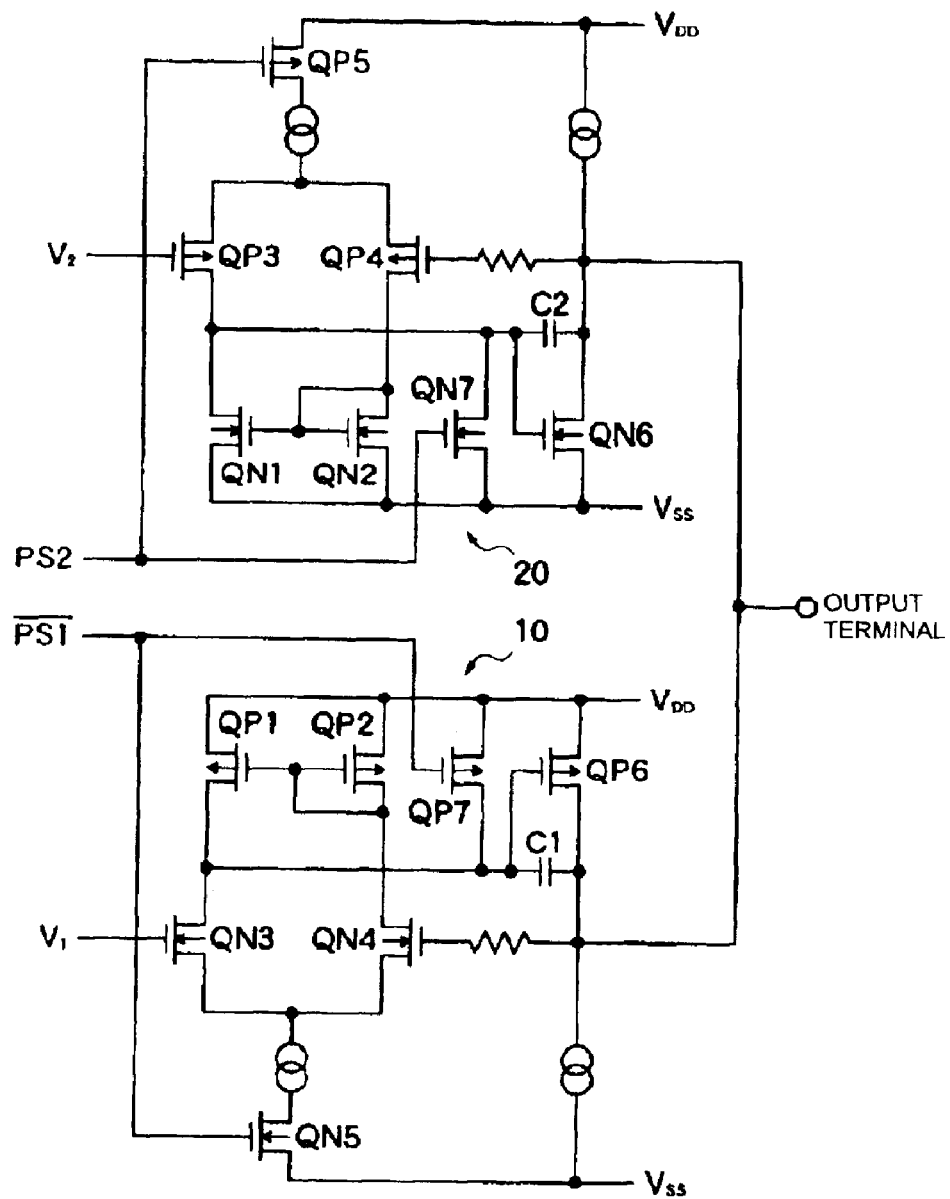
FIG. 2 shows a specific example of the first amplifier circuit and the second amplifier circuit shown in FIG. 1.

FIG. 2 shows a specific example of the first amplifier circuit and the second amplifier circuit.

The first amplifier circuit 10 comprises a differential amplifier comprising p-channel transistors QP1 and QP2, and n-channel transistors QN3 and QN4; an n-channel transistor QN5, which turns on and off an operating current of the differential amplifier; a p-channel transistor QP6 of the output stage; a p-channel transistor QP7, which cuts off the transistors of the output stage; and a capacitor C1 for phase compensation.

When the first control signal PS1 bar remains at a low level, the transistor QN5 is "off" and thereby the differential amplifier is suspended, while the transistor QP7 is "on" and thereby the transistor QP6 of the output stage is cut off. On the contrary, when the first control signal PS1 bar is turned to a high level, the transistor QN5 is switched on and thereby the differential amplifier is activated, while the transistor QP7 is switched off and thereby the transistor QP6 of the output stage is activated.

The second amplifier circuit 20 comprises a differential amplifier comprising n-channel transistors QN1 and QN2, and p-channel transistors QP3 and QP4; a p-channel transistor QP5, which turns on and off an operating current of the differential amplifier; an n-channel transistor QN6 of the output stage; an n-channel transistor QN7, which cuts off the transistors of the output stage; and a capacitor C2 for phase compensation.

When the second control signal PS2 remains at a high level, the transistor QP5 is "off" and thereby the differential amplifier is suspended, while the transistor QN7 is "on" and thereby the transistor QN6 of the output stage is cut off. On the contrary, when the second control signal PS2 is turned to a low level, the transistor QP5 is switched on and thereby the differential amplifier is activated, while the transistor QN7 is switched off and thereby the transistor QN6 of the output stage is activated.

Figure 3:
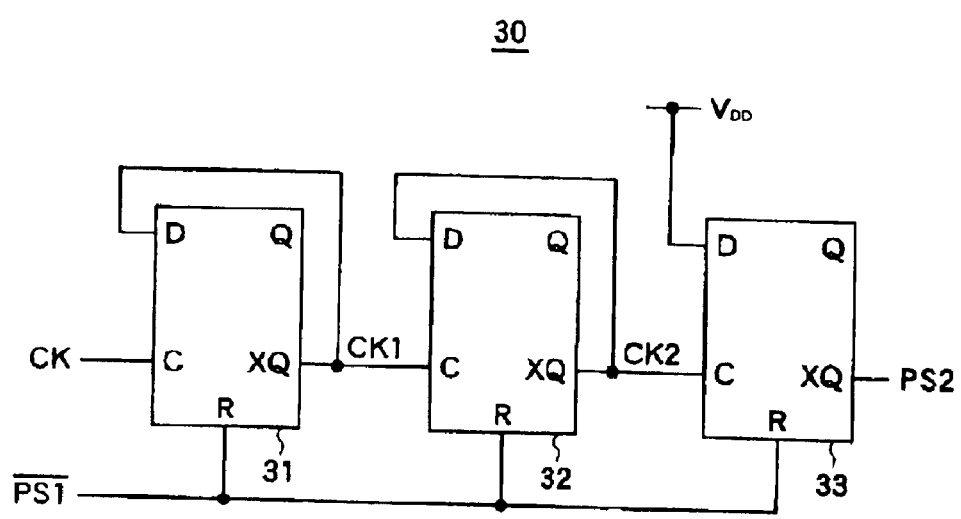
FIG. 3 shows a specific example of the control circuit show in FIG. 1.

FIG. 3 shows a specific example of the control circuit. As shown in FIG. 3, the control circuit 30 comprises three flip-flops 31, 32, and 33. Reset signal input terminals of the flip-flops 31 to 33 each receive the first control signal PS1 bar. In power save mode, the first control signal PS1 bar remains at a low level, while flip-flops 31 to 33 each send out a high-level signal from their inverted output terminals.

Figure 4:
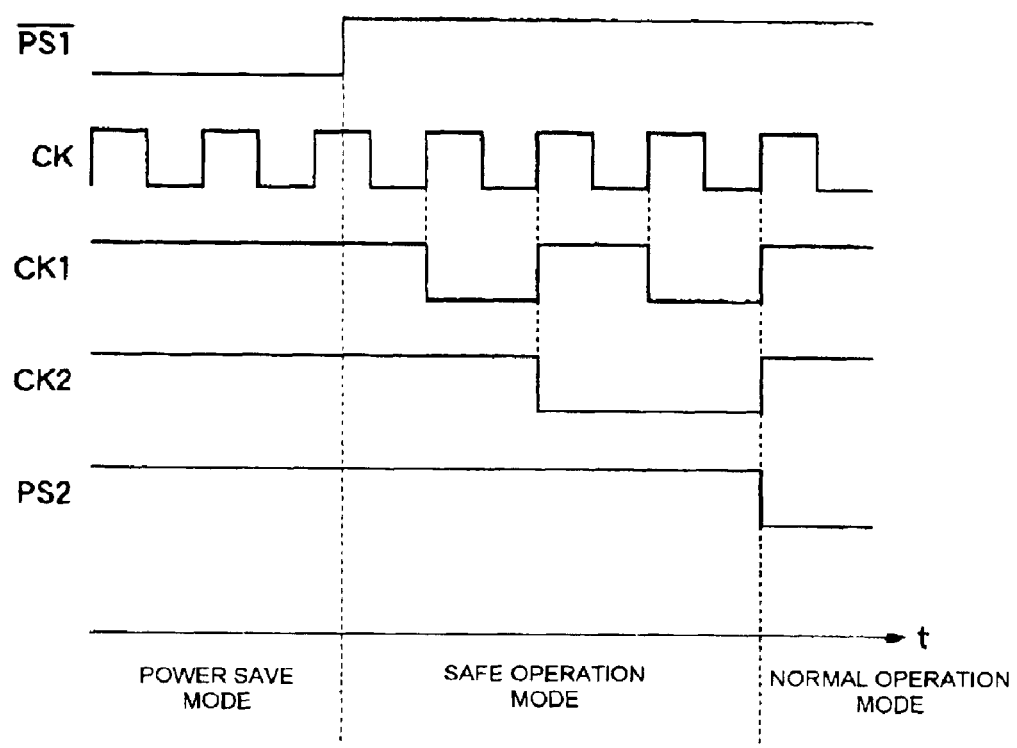
FIG. 4 is a timing chart illustrating operations of the control circuit shown in FIG. 3.
Figure 5:
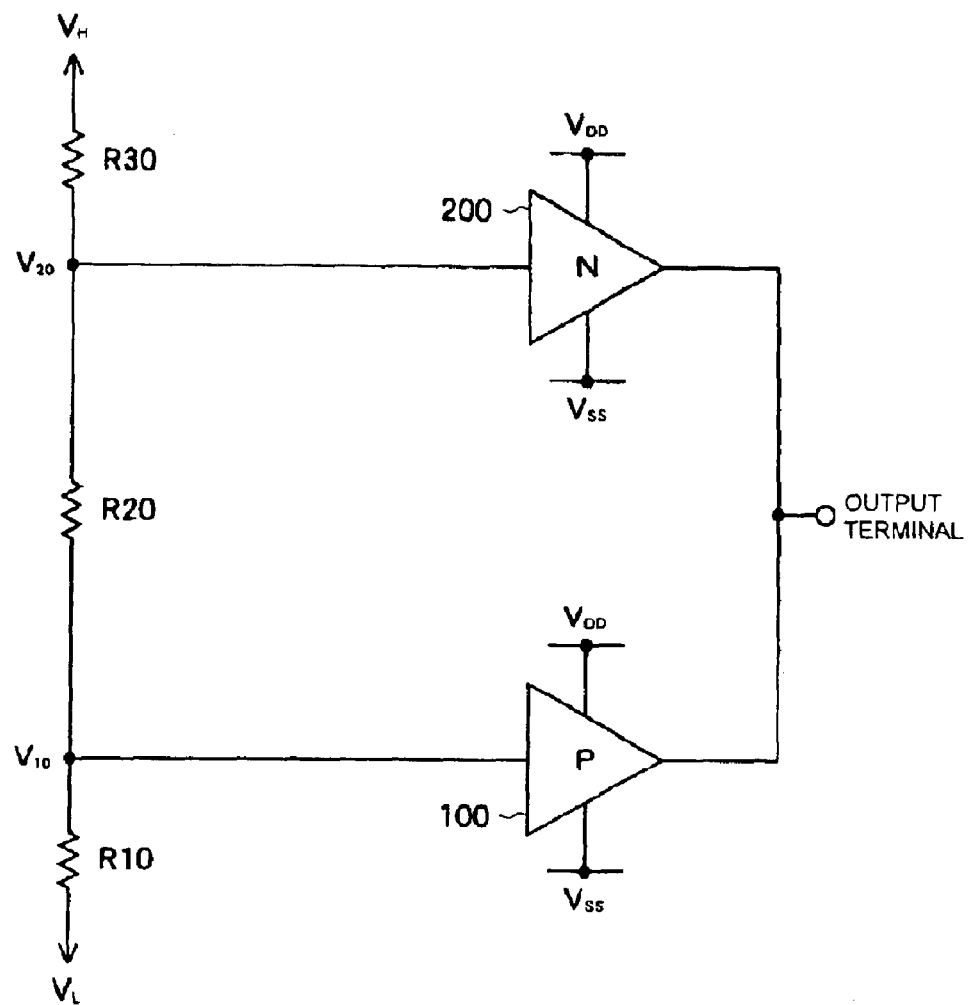
FIG. 5 is a diagram showing a structure of a conventional power circuit.

FIG. 4 is a timing chart illustrating operations of the control circuit shown in FIG. 3. When the first control signal PS1 bar turns a high level and the power save mode is thereby cleared, the operation shifts to safe operation mode. In the safe operation mode, the flip-flop 31 sends out a first divided clock signal CK1 by dividing an input clock signal CK into two, while the flip-flop 32 sends out a second divided clock signal CK2 by dividing the first divided clock signal CK1 into two. At the same time, the flip-flop 33 synchronizes with a rising edge of the second divided clock signal CK2, turning the second control signal PS2 output from its inverted output terminal to a low level. Then, the operation shifts from the safe operation mode to normal operation mode.

Referring to FIGS. 2 to 4, since in the power save mode, the first control signal PS1 bar remains at a low level and the second control signal PS2 at a high level, the differential amplifiers and the transistors of the output stage in the amplifier circuits 10 and 20 do not operate. After the operation shifts to the safe operation mode, the first control signal PS1 bar turns to a high level, while the second control signal PS2 remains at a high level. Therefore, the first amplifier circuit 10 is activated thereby, while the second amplifier circuit 20 is not activated. After the operation shifts to the normal operation mode, the first control signal PS1 bar turns to a high level and the second control signal PS2 to a low level, so that both the amplifier circuits 10 and 20 are activated.

When the power save mode is thus cleared, by shifting a time for activating the amplifier circuit 10 from a time for activating the amplifier circuit 20, a short-circuit current from the transistor QP6 of the output stage of the first amplifier circuit 10 to the transistor QN6 of the output stage of the second amplifier circuit 20 can be prevented thereby. In particular, when a potential of the output terminal rises, a high potential is applied to a gate of the transistor QN6 of the output stage of the second amplifier circuit 20 via the capacitor C2 for phase compensation. However, making the transistor QN7 remain "on" for a predetermined period of time can prevent an excessive current flowing in the transistor QN6 of the output stage. Furthermore, since it is unnecessary to increase an offset between the first potential $V_1$ and the second potential $V_2$, the problem that an output voltage of the power circuit oscillates as if to ripple can be solved.

EFFECT OF THE INVENTION

As described herein, according to the present invention, in a semiconductor integrated circuit comprising a power circuit, which supplies a given voltage to a load in a push-pull manner, a large current flowing from a p-channel transistor to an n-channel transistor of the output stage when the power circuit is activated can be prevented.

The entire disclosure of Japanese Patent Application No. 2002-272471 filed Sep. 19, 2002 is incorporated by reference.

What is claimed is:

1. A semiconductor integrated circuit, comprising:

a first amplifier circuit which receives a first potential and then supplies a current to an output terminal;

a second amplifier circuit which receives a second potential and then absorbs a current from the output terminal; and a control circuit which controls the second amplifier circuit so that the second amplifier circuit starts operating subsequent to a predetermined period of time that elapses after the first amplifier is activated, wherein the control circuit, by counting a clock signal, makes a state of a second control signal supplied to the second amplifier circuit change subsequent to a predetermined period of time that elapses after a state of a first control signal supplied to the first amplifier circuit changes.

2. The semiconductor integrated circuit according to claim 1, further comprising a potential generating circuit which generates the first potential and the second potential so as to make the first potential higher than the second potential.

3. The semiconductor integrated circuit according to claim 1, wherein:

the first amplifier circuit comprises a first differential amplifier and a p-channel transistor of an output stage; and the second amplifier circuit comprises a second differential amplifier and an n-channel transistor of the output stage.

4. The semiconductor integrated circuit according to claim 3, wherein:

the first amplifier circuit further comprises a first transistor which makes the p-channel transistor of the output stage cut off according to a first control signal in a first mode; and the second amplifier circuit further comprises a first transistor which makes the n-channel transistor of the output stage cut off according to a second control signal in the first mode and a second mode.

5. The semiconductor integrated circuit according to claim 4, wherein:

the first amplifier circuit further comprises a second transistor which supplies a current to two transistors forming a differential pair of the first differential amplifier according to a first control signal in the second mode and a third mode; and the second amplifier circuit further comprises a second transistor which supplies a current to two transistors forming a differential pair of the second differential amplifier according to a second control signal in the third mode.

* * * * *